(12) United States Patent
Gerowitz et al.

(10) Patent No.: US 6,681,356 B1
(45) Date of Patent: Jan. 20, 2004

(54) SCAN CHAIN CONNECTIVITY

(75) Inventors: Robert Glen Gerowitz, Raleigh, NC (US); Benjamin Edward Floering, Durham, NC (US); Kenneth Patrick Zabrycki, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 445 days.

(21) Appl. No.: 09/676,168

(22) Filed: Sep. 29, 2000

(51) Int. Cl.$^7$ .............................. G01R 31/28; G06F 9/45
(52) U.S. Cl. ........................................ 714/729; 716/10
(58) Field of Search .............................. 714/729; 716/10

(56) References Cited

U.S. PATENT DOCUMENTS

| | | | | |
|---|---|---|---|---|
| 4,441,075 | A | | 4/1984 | McMahon .................... 324/73 |
| 5,109,383 | A | | 4/1992 | Chujo ........................ 371/22.3 |
| 5,717,700 | A | * | 2/1998 | Crouch et al. ............... 714/726 |
| 5,828,579 | A | * | 10/1998 | Beausang ....................... 716/2 |
| 5,949,692 | A | | 9/1999 | Beausang et al. ............ 364/491 |
| 6,256,770 | B1 | * | 7/2001 | Pierce et al. ................. 716/18 |
| 6,343,365 | B1 | * | 1/2002 | Matsuzawa et al. ......... 714/726 |

FOREIGN PATENT DOCUMENTS

| | | |
|---|---|---|
| JP | 1080884 | 3/1989 |
| JP | 1302850 | 12/1989 |
| JP | 9-305642 | 11/1997 |

OTHER PUBLICATIONS

Kobayashi, M. Edahiro, and M. Kubo; Scan–chain optimization algorithms for multiple scan–paths; Proceedings of the IEEE Asia and South Pacific Design Automation Conference; Feb. 10–13, 1998; Page(s): 301–306.*

Kee Sup Kim and L. Schultz; Multi–frequency, multi–phase scan chain; Proceedings IEEE International Test Conference, Oct. 2–6, 1994; Page(s): 323–330.*

Lock–Free Chaining for Block–Scanning in Multiprocessing Environments; IBM Technical Disclosure Bulletin, Jul. 1989, US; vol. 32; Issue 2; p. 170–171.*

S. Das Gupta et al., "Method for Improving the Wirability of Chips," *IBM Technical Disclosure Bulletin*, vol. 23, No .8, Jan.,1981, pp. 3900–3901.

M. Feuer et al., "Method for Rechaining Shift Register Latche Which Contain More Than One Physical Book," vol. 25, No. 9, February, 1983, pp. 4818–4820.

W. V. Huott et al., "Advanced Microprocessor Test Strategy and Methodology," vol. 41, No. 4/5, Jul. 21, 1997, pp. 1–20.

* cited by examiner

*Primary Examiner*—Albert Decady
*Assistant Examiner*—Joseph D. Torres
(74) *Attorney, Agent, or Firm*—Winstead, Sechrest & Minick

(57) ABSTRACT

Scan chains are designed for an IC based on test coverage for functional logic units, Before physical placement the scan circuit elements are assigned scan attributes which define which scan circuit elements must remain coupled and also defines which groups of scan circuit elements must remain in selected groups. The scan chains and the logic are physically placed and location data on the scan circuit elements are determined from the placement data. Using the scan attributes, single scan circuit elements and scan circuit elements that must remain connected (sub-scan chains) are re-allocated across a same number of new scan chains. These scan circuit elements are rewired using an algorithm that minimizes scan path lengths within the new scan chains.

18 Claims, 6 Drawing Sheets

SCAN CHAIN CONNECTIVITY

TECHNICAL FIELD

The present invention relates in general to an integrated circuit (IC) and, in particular, to using scan chains for applying inputs or receiving outputs from the IC where the scan chains have a functional as well as a test operation.

BACKGROUND INFORMATION

Due to the ever decreasing geometries in today's very large scale integration (VLSI) designs, the effects of circuit loading due to wiring capacitance are becoming more and more significant. The decreasing geometry is also resulting in larger numbers of logic gates in designs which necessitate automatic manufacturing test generation techniques. However, these techniques typically add additional test only paths, which can impart many negative characteristics, such as increased loading due to additional circuits processing signals connected to scan chains and additional complexity incurred during wiring signals due to the extra connections and long wire lengths required. These test only paths are typically added during the logic synthesis phase of design and are typically arbitrarily connected.

Another factor complicating VLSI design is what is termed manufacturing test requirements. Since every product must be tested, manufacturers of VLSI impose restrictions which when implemented allow them to maximize throughput in manufacturing testers. One aspect of design which affects tester throughput is the degree of balance within the scan chains of an IC device as scan cycles may be wasted loading and measuring results of short chains while operations are being performed on longer scan chains.

There are other applications where scan chains are used during functional operation of a design. For instance, a design might have a finite state machine which contains a reset state. This reset state then causes a predetermined value to be propagated to all scan elements outside of those comprising the finite state machine. Inverting circuit elements may also be placed in the scan path to allow scan circuit elements to be reset to different values. Other applications where scan chains may have functional operation include an imbedded processor which has a reset operation which causes a known value to propagate through the scan path excepting those scan circuit elements comprising the processor. Since scan chains have functional as well as test applications it has not been possible to optimize these chains using prior art methods since certain scan circuit elements had to maintain their functional connections.

The solution to wiring scan chains in the industry does not move scan elements from the scan chain on which they were originally placed. If as the result of a synthesis a scan chain was threaded around an entire region of the design, then optimizations would just result in some improvement on the scan chain but it may still be threaded around the entire region of the design.

Therefore, there is a need for a method to generate data describing scan chains on an IC, partition the scan chains into balanced scan chain elements and reconnect the scan chain to reduce and optimize the signal loading capacitances resulting from the scan chain paths while maintaining those scan circuit element connections needed functional operation.

SUMMARY OF THE INVENTION

The present invention uses an optimization method wherein virtually all the test scan paths of all scan chains are partitioned (discarded) while functional scan chain connections are maintained. The scan circuit elements in the design are then placed, during circuit layout, factoring only the functional interconnections. Attributes are assigned to selected scan circuit elements that define which scan circuit elements are to remain connected, which scan circuit elements may be interchanged within a group and which scan circuit elements are the beginning and end of new scan chains. The scan chain paths are then restored using a nearest neighbor type of algorithm thus ensuring minimal additional wiring capacitances. The method has the ability to regenerate scan chains using scan elements from any scan chain with the same group number as defined by a scan attribute. The method also allows the automatic balancing of the scan chains by placing approximately the same number of scan circuit elements into each new scan chain which is desirable for the manufacturer of the IC.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
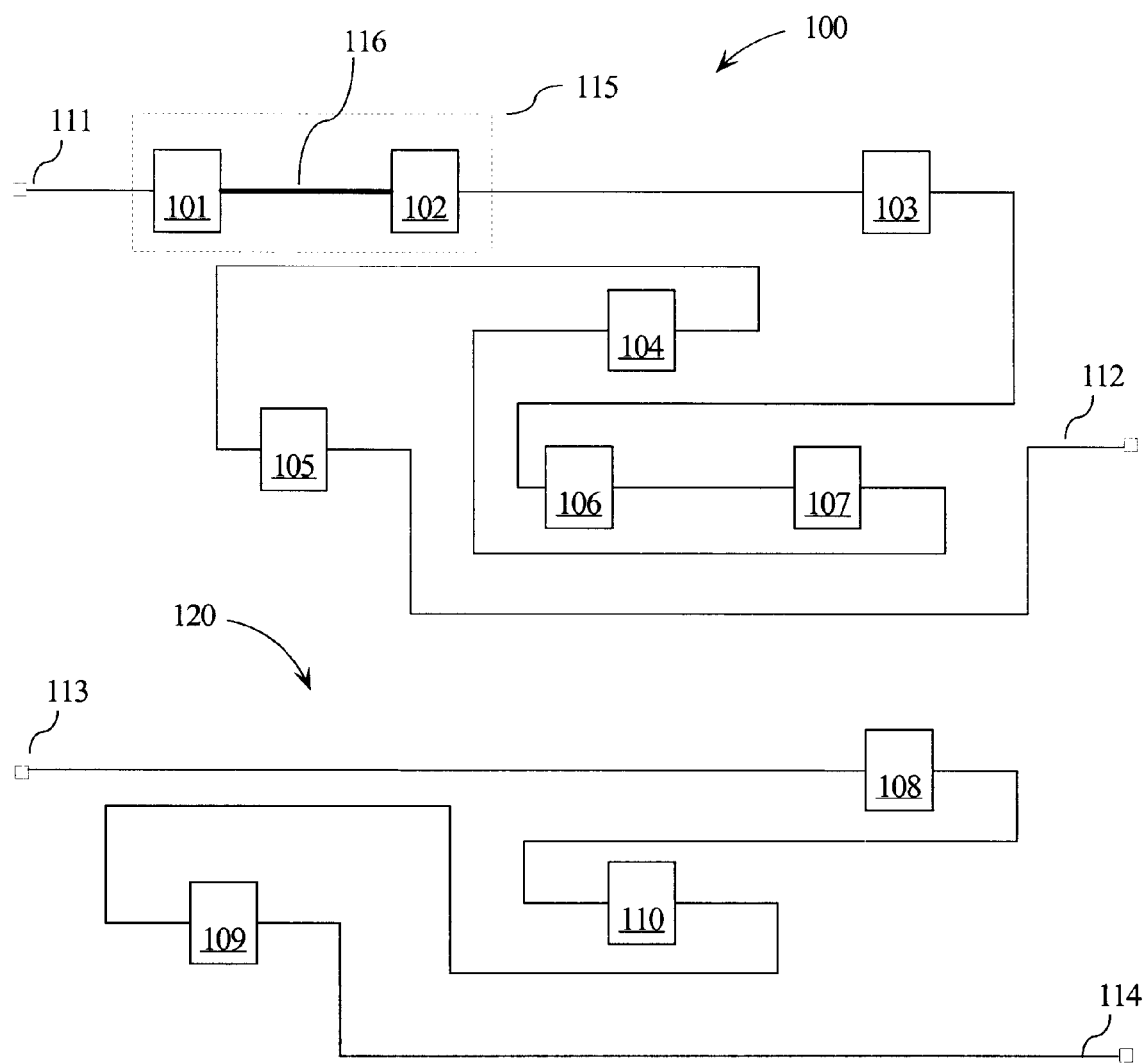
FIG. 1 illustrates two scan chains with an unequal number of scan circuit elements.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like may have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

The present invention discloses a method for optimizing scan chains for connection path lengths and for balancing the number scan circuit elements within the scan chains. This method includes algorithms that are used to do the actual optimization of the interconnection paths after the scan circuit elements are placed during layout of the IC. In the following disclosure the term "algorithm" is used and the following details a general description of an algorithm that may be used in embodiments of the present invention. Also included in the following are some procedures and a problem formulation relating to optimizing scan chains according to embodiments of the present invention.

The following conditions may apply for an existing design in embodiments of the present invention:

1. The scan chain nets may have been detached back one Steiner point (because many scan-out nets are functional as well as used for test).
2. During design, circuits are placed in layout with the netlist of (I above) using standard placement algorithms. Better results are obtained because the netlist contains less connections (reduce complexity) and these connections are all functional (non-test)
3. Each scan circuit element contains an integer number of scan bits, latches contain one scan bit while random access memories (RAMs), hard macros, and certain user-defined static scan sections contain multiple scan bits. The total number of scan chain bits in the design may be referred to as a number B.

Problem Formulation

The problem of optimization of the scan paths and balancing the scan circuit elements may be stated as follows: Partition the scan circuit elements into a user defined number of groups (N). Each group N should contain B/N bits where B/N is rounded up to the next higher integer or down to the next lower integer. Each group should also be contiguous with respect to placement on the chip layout.

Algorithm Description

A useable algorithm is based on cellular automata and simulated annealing techniques. It is similar to cellular automata in that after the initial matrix is formed, each matrix element has identical elementary automation. Input for each elementary automation comes from neighboring cells, and the next sated in time only depends on the cell's current state and the state of its neighbors. Normally, cellular automation is performed in a n-dimensional Euclidian space partitioned into cells of equal size. This is not the case with the following algorithm because some cells are merged to get the correct number of scan chains, and the size that each cell occupies changes with each time step. The following algorithm is similar to simulated annealing because the system can be thought of as having a "temperature" T of:

$$T = \text{Summation from } n=1 \text{ to } N \text{ of } (M\text{-bits}_n)$$

where M is the maximum number of bits in any one scan chain group, and $\text{bits}_n$ is the number of scan bits in group n. The goal of the algorithm is to get to the lowest possible value of T, which may be shown to be:

$$T_{final} = B \bmod N (B \text{ modulo } N)$$

Local minima are possible with this algorithm, so a mechanism is implemented to help traverse these minima. Finally, two modes of operation may be used to get to the final temperature $T_{final}$ because the normal mode may get "stuck" when the devices with a large number of scan bit counts fall near group boundaries. The optimization program has a "normal mode" which is run until no improvement it is detected. The optimization program is then switched to a "precision mode" where the goal is to get each scan chain length (as determined by the number of scan circuit elements) to B/N, where B/N may be rounded up or down to a next integer value. This is done by sacrificing a small amount of contiguousness for perfectly balanced scan chains.

The following are five high level steps for obtaining balanced, contiguous scan chains. Each procedure in the steps is further described in detail in following psuedo code.

High Level Algorithm Steps

1. Obtain initial matrix using Initialize_Matrix(N)
2. Run cellular automata/simulated annealing until no improvement is made for the last m cycles using Run_Automata ("normal", m)
3. The user has the option to Raise_Temperature any number of times and run step 2, proceed to step 5 if the current results are acceptable.
4. Run_Automata ("precision", m)
5. Connect each group using a "traveling salesman" algorithm.

Procedure Illustrated in Pseudo Code

```
Initialize_Matrix(N)
    xlen=largest x of all scan elements–smallest x of all
        scan elements
    ylen=largest y of all scan elements–smallest y of all
        scan elements
    savelen=a LARGE number
    for n set to a value 1 to K where K=square root of N
        rounded to the next higher integer
    do tinplen set to a value=absolute value of ((ylen/n)–
        (xlen/D)) where
    D
    is=N/n rounded to the next higher integer.
        if Imp/en<savelen
            then set xdim=D
                set ydim=n
                set savelen=tmplen
            set tmp/en=absolute value of ((ylen/D)–(xlen/n))
        if tmplen<savelen
            then set xdim=n
                set ydim=D
                set savelen=tmplen
    split xlen into xdim segments of size xlenlxdim (this
        defines x location grid)
    split ylen into ydim segments of size ylenlydim (this
        defines y location grid)
    allocate scan elements into (xdim) x (ydim) objects
        according to location grid
    assign von Neumann neighborhood properties to each
        object
    for r set equal to 1 to (xdim) x (ydim)–N
    do find object in grid with least amount of scan bits
        find the von Neumann neighborhood that has the least
            number of scan bits mark these two objects
            "merged", they represent one scan group
    return the (xdim) x (ydim) objects and their properties.
Run_Automata(mode, m)
    spawn cellular automata processes for each grid element Automaton(mode)
    while improvement was made for last m iterations
```

```
    do increment cellular automata time
        recalculate temperature T (for improvement
            calculation)
        get new scan grouping from automatons, terminate
            them, and return
Automaton(mode)
    do forever
        if time was incremented
            then if bits_this>u_n_bits (upper neighborhood bits)
                then Move_Element(this, u_n, mode)
                else if bits_this<u_n_bits
                    then Move_Element(u_n, this, mode)
            then if bits_this>r_n_bits (right neighborhood bits)
                then Move_Element (this, r_n, mode)
                else if bits_this<r_n_bits
                    then Move_Element(r_n, this, mode)
Move_Element(source, dest, mode)
    ele is set=scan element in source that is closest to those
        in dest
    if mode="precision"
        then while ele_bits>G where G is=(source_bits−
            dest_bits)/2 rounded
            to the next higher integer.
            do ele from source, and put in dest
        delete ele from source, and put in dest
Raise_Temperature( )
    choose first randomly from set of all matrix elements
    choose second randomly from neighbors of first
    if bits_first (<or=) bits_second
        then Move_Element(first, second, "normal")
        else Move_Element(second, first, "normal")
```

Embodiments of the present invention allow designers to work on the functional design aspects while allowing the physical placement designers more latitude in where scan circuit elements are placed. This also minimizes the additional delays caused by scan paths which are shared with functional paths. Embodiments of the present invention assign four scan attributes in a design net list. These scan attributes allow designs to be processed with or without existing scan chain connections, designs where partial ordering of an existing scan chain must be maintained, and designs where latch (scan circuit element) placement in the scan chain must be maintained. These attributes are assigned to an existing net list before the scan circuit elements are partitioned. The following is a list of scan attributes used in embodiments of the present invention and their definition:

START (S) This boolean attribute (logic one or zero) is assigned as a logic one to a scan circuit element that precedes the first latch in an existing scan chain. S=1 indicates that the scan circuit element remains connected to an external scan input if it existed. An S=0 indicates no S scan attribute END (E) This attribute (value 1 to n) is usually assigned to the last scan circuit element immediately following the last latch in an existing scan chain. All of the scan circuit elements between an S (S=1) and a particular E (E=1 to n) are considered as a group. The number "n" is an integer in this attribute. Any scan circuit element may be interconnected in like groups during optimization. An E=0 indicates no E scan attribute KEEP1 (K1) This attribute (logic one or zero) is assigned to individual scan circuit elements within a group to further define whether their scan input connections remain or whether they may be broken. A K1=1 indicates an input connection that must be retained. K1=0 indicates the scan circuit element has no KEEP1 scan attribute.

KEEP2 (K2) This attribute (logic one or zero) is assigned to individual scan circuit elements within a group to further define whether their scan output connections remain or whether they may be broken. A K2=1 indicates an output connection that must be retained. K2=0 indicates the scan circuit element has no KEEP2 scan attribute.

Scan circuit elements that belong to a same group as defined by the END attribute (e.g., E=1 to n) may be interchanged with scan circuit elements in another same group depending on the assignment of the individual KEEP attributes (K1 or K2). If the KEEP attribute indicates that a number of scan circuit elements must remain connected, the connected scan circuit elements (sub-scan chain) may still be interchanged within another group with the same END attribute number (1 to n).

FIG. 1 illustrates two scan chains 100 and 120. Scan chain 100 comprises scan circuit elements 101–107 with scan input 111 and scan output 112. Scan circuit elements 101 and 102 are illustrated as a sub-chain 115 where scan circuit elements 101 and 102 must remain coupled (connection 116) as determined prior to optimization. Scan chain 120 comprises scan circuit elements 108–110 with scan input 113 and scan output 114. Scan chains 100 and 120 are illustrated in FIG. 1 as having paths, which interconnect the scan circuit elements, longer than may be necessary to wire the scan circuit elements. Also, scan chain 100 has seven scan circuit elements (101–107) and scan chain 120 only has three scan circuit elements (108–110) indicating that the scan chains are unbalanced. Balancing scan chains in embodiments of this invention uses techniques to attempt to make the number of scan circuit elements in each scan chain equal. While perfect balance is not attained in all cases it is a goal of optimization according to embodiments of the present invention.

Figure 2:
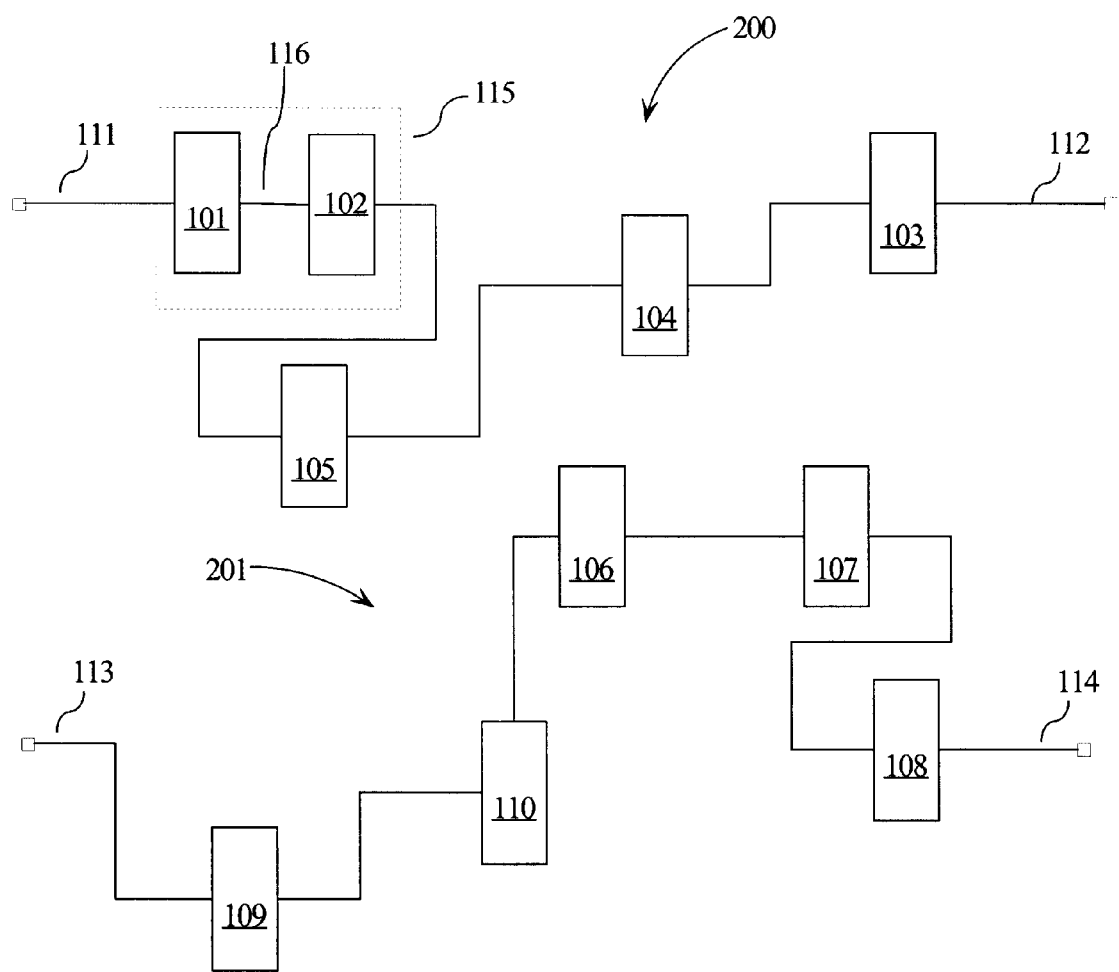
FIG. 2 illustrates the two scan chains in FIG. 1 rewired into balanced scan chains with shorter wiring paths.

FIG. 2 is an illustration of a resulting wiring of the scan circuit elements 101–110 of FIG. 1 into scan chains according to embodiments of the present invention. The wiring of the various scan circuit elements (e.g., 101–107), between scan input 111 and scan output 112, indicates that a more optimum wiring may be possible to reduce scan path wiring. Sub-scan chain 115 is a sub-scan chain where scan circuit elements 101 and 102 must remain coupled (requirements of the particular illustrative design). New scan chain 200 results from wiring scan input 111 to successive sub-scan chains 115, 105, 104, and 103 and then to scan chain output 112. The term "sub-scan chain" is used in this disclosure to refer to any set of scan circuit elements, including a single scan circuit element, smaller than a complete scan chain. New scan chain 201 results from wiring scan input 113 to successive sub-scan chains 109, 110, 106, 107, and 108 and then to scan output 114. The new scan chains 200 and 201 are not illustrated to scale but rather are illustrated to show how embodiments of the present invention maintain sub-scan chains connections previously determined (e.g., sub-scan chain 115) and re-allocates sub-scan chains (scan circuit elements from sub-scan chain 100 were moved to 120) to balance the number of scan circuit elements in each new scan chain 200 and 201. In this example, the new scan chains 200 and 201 each have five scan circuit elements, however, all optimizations according to embodiments of the present invention may not be able to balance the new scan chains so that they have exactly the same number of scan circuit elements. Nevertheless, new balanced scan chains (e.g., 200 and 201) should have a better allocation of scan circuit elements after optimization.

Figure 3:
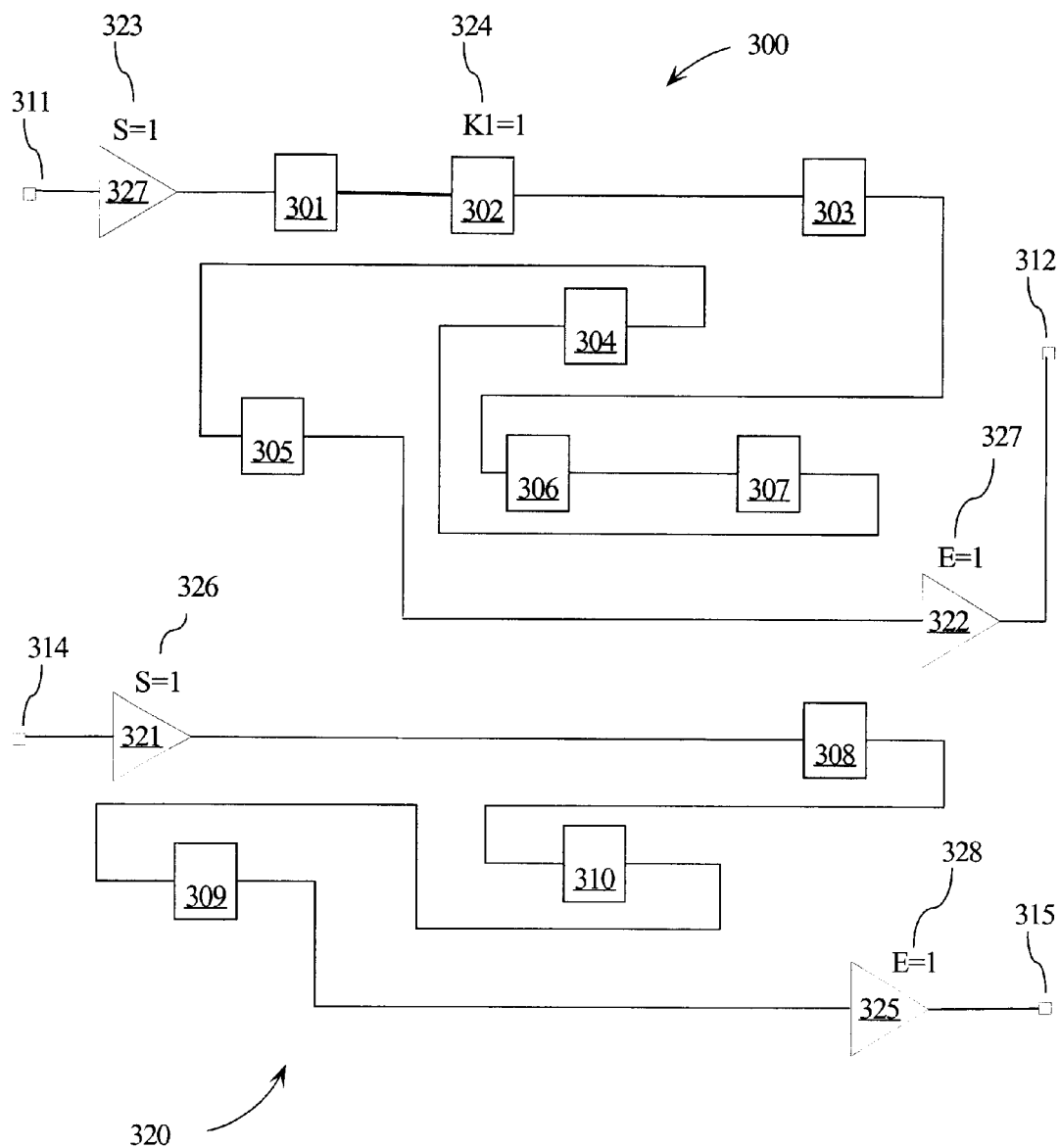
FIG. 3 illustrates two groups of sub-scan chains and associated scan inputs and scan outputs and some scan attributes.

FIG. 3 illustrates scan chains where single scan attributes 328, 323, 324, 326 and 327 are shown assigned to selected scan circuit elements 305, 307, 302, 301 and 322 respectively. Scan circuit elements 301–310 are considered scan latches in this illustration. In FIG. 1, scan chain 100 is defined as extending from a scan input 111 to a scan output 112. In FIG. 3, a buffer 302 is coupled to the scan output 312 and a buffer 307 is coupled to the scan input 311. A scan attribute 323 (S=1) is assigned to the scan circuit element 307 and a scan attribute 327 (E=1) is assigned to scan circuit element 302. In this manner all the scan circuit, elements 301–307 (scan circuit elements connected between a scan circuit element 327 with a scan attribute S=1 to scan circuit element 322 with a scan attribute E=1) are considered as belonging to the same group (group 1) defined by the E scan attribute number (in this case 1). Only scan circuit elements associated with the same E scan attribute number (e.g., E=1) belong to the same group 1. Scan chain 320 has buffers 321 and 325 with assigned scan attributes 326 (S=1) and 328 (E=1). Since scan chains 300 and 320 have the same assigned E scan attribute number, (E=1 for scan circuit elements 322 and 325) their scan circuit elements belong to the same group (group 1) and as such may have scan circuit elements reallocated between them during optimization to balance the scan chains (300 and 320). Scan circuit element 302 also has a K1 scan attribute 324 (K1=1). The scan attribute 324 (K1=1) indicates that the input connection to scan circuit element 302 must remain as previously assigned before optimization (connected to scan circuit element 301). However connected scan circuit elements 301 and 302 may be moved as a sub-scan chain within other groups with scan circuit elements having the same E scan attribute number to balance scan chains.

After scan circuit elements have been assigned scan attributes, the scan circuit devices that must remain connected are defined, the groups as identified by their END number are defined and the scan chains are ready for physical layout placement where the scan circuit elements are placed according only to functional considerations. The scan attributes previously assigned will determine which scan elements may be rewired into new scan chains to optimize the scan paths and balance the number of scan circuit elements. A group of scan circuit elements within a defined START scan attribute (S=1) and an E scan attribute (E=1 to n) may have selected scan circuit elements that must remain connected (e.g., 301 and 302) as well as single scan circuit elements (e.g., 303 and 304) that may be connected in any order within their present group or may be connected to in other groups associated with the same E scan attribute number. The S scan attribute 326 (S=1) also indicates that the scan circuit element 321 that its previously assigned input connection to a scan input (in this case scan input 314) is retained. Similarly, scan attribute 328 (E=1) also indicates that scan circuit element 325 retain its output connection to a previous assigned scan output (in this case scan output 325).

Figure 5:
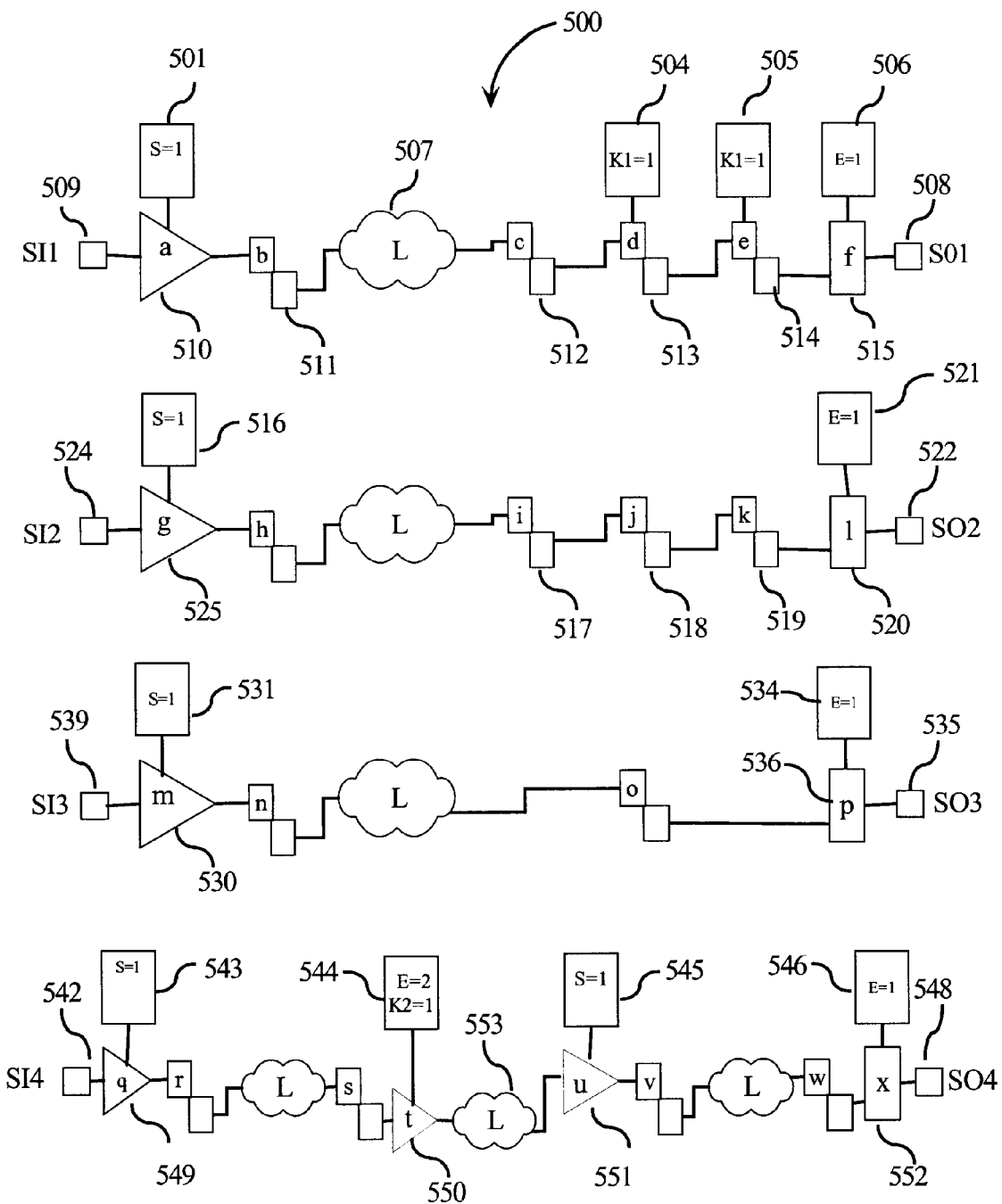
FIG. 5 illustrates an embodiment of the present invention with attributes assigned to scan circuit elements in multiple scan chains.

FIG. 5 illustrates four scan chains with (before optimization) external scan inputs 509, 524, 539 and 542 and scan output 508, 522, 535, and 548 respectively. These scan chains may also have logic (e.g., 507) shown in the scan path. Logic 307 may receive scan signals but may not themselves have scannable circuit elements. The scan chains in FIG. 5 are used to illustrate how scan attributes may be assigned to scan circuit elements to indicate conditions for rewiring the scan chains for optimization. In FIG. 5, if a scan attribute is not used (e.g., S=0, E=0, K1=0, or K2=0) they are not shown. Only those scan attributes that define a circuit connection are shown as associated with a scan circuit element. These scan chains are shown before optimization so the process may be fully understood. Scan attributes are assigned to scan circuit elements before circuit placement or optimization. The scan chain between scan input 509 and scan output 508 has scan latches 511, 512, 513, and 514. Buffer 510, while a scan circuit element in the scan path, is not itself a scannable device. Likewise, scan circuit element 515 may also be a multiplexer or other non-scan latch circuit. These scan circuit elements, nevertheless, are in the scan path.

Scan chain 500 illustrates the restrictions that may be placed on sub-scan chains by the assignment of particular scan attributes such as S, E, K1 or K2. Scan attributes 501, 504, 505, and 506 are assigned to define the scan connection options for selected scan circuit elements 510, 513, 514 and 515 respectively. Two key scan attributes are scan attribute 501 (S=1) and scan attribute 506 (E=1). The assignment of these scan attributes cause all the scan circuit elements between scan circuit elements 515 and 510 to be assigned to a group (group 1) defined by the E scan attribute number (e.g., E=1). Scan circuit elements (sub-scan chains) with one group number may only be rewired with sub-scan chains in a group with a like group number. Scan attribute 501 (S=1) indicates that scan circuit element 510 is the first circuit element in a scan chain and also indicates that if it has an input connection to an existing scan input it is retained (in this case scan input 509), however, its output connection may be rewired. Scan circuit element 5111has no scan attribute that restricts is wiring and it may be rewired into any scan elements with a like group number (in this case a group 1). Scan circuit element 515 has scan attribute 506 (E=1). Its scan attribute 506 (E=1), besides indicating a group number (e.g., group 1), indicates that scan circuit element 515 is the last circuit element in a scan chain and that it retains its output connection to scan output 508 during optimization. However its input connection may be rewired.

The scan attribute 505 (K1=1) for scan circuit element 514 indicates that its input connection must remain coupled to scan circuit element 513. Likewise, scan attribute 504 (K1=1) for scan circuit element 513 indicates that it must remain coupled to scan circuit element 512. In this manner, the K1 and K2 scan attributes define which scan circuit elements remain coupled as a sub-scan chain during optimization. Scan circuit elements 525 and 520 have scan attributes 516 and 521 respectively. The scan attributes 516 and 521 are the same as the scan attributes for scan circuit elements 510 and 515 respectively indicating that they also belong to the same group (group 1 since E=1 for scan, circuit element 520). Scan circuit elements 517, 518, and 519 also belong to a group 1 (associated with scan attribute E=1 for scan circuit element 520) and have no scan attributes. Therefore scan circuit elements 517, 518, and 519 may be reallocated and rewired (in any order) with any other scan circuit elements in another group 1 (e.g., 512 and 513).

Scan attributes 531 and 534 are associated with scan circuit elements 530 and 536 respectively. These scan circuit elements have connections defined by their scan attributes 531 and 534 respectively. Scan circuit elements 530 is the first circuit element in a scan chain (scan attribute 531 S=1) and the last circuit element (scan attribute 534 E=1). Scan attributes 543 and 544 define scan circuit elements that belong to a second group. Scan attributes 544 and 543 define all the scan circuit elements between scan circuit element 549 with scan attribute 543 (S=1) and scan circuit element 550 with scan attribute 544 (E=2) as being part of the group (group 2) with E scan attribute number two (E=2). The scan circuit elements in this group 2, which do not have K scan attributes (K1 or K2), are free to be rewired only within a like defined group 2. Scan circuit element 550 is the last circuit element a scan chain (by virtue of its E scan attribute E=2) but it does not have a pre-existing connection to a scan output. To retain the output connection of such a scan circuit element a K scan attribute (K2=2) is used. In this case scan circuit element 550 with scan attribute 544 (K2=2) retains its output connection to Logic 553. Scan attributes 545 and 546 define another group 1 (scan attribute 546 E=1). All the scan circuit elements between scan circuit element 551 and 552 are also assigned to as a group 1.

Figure 6:
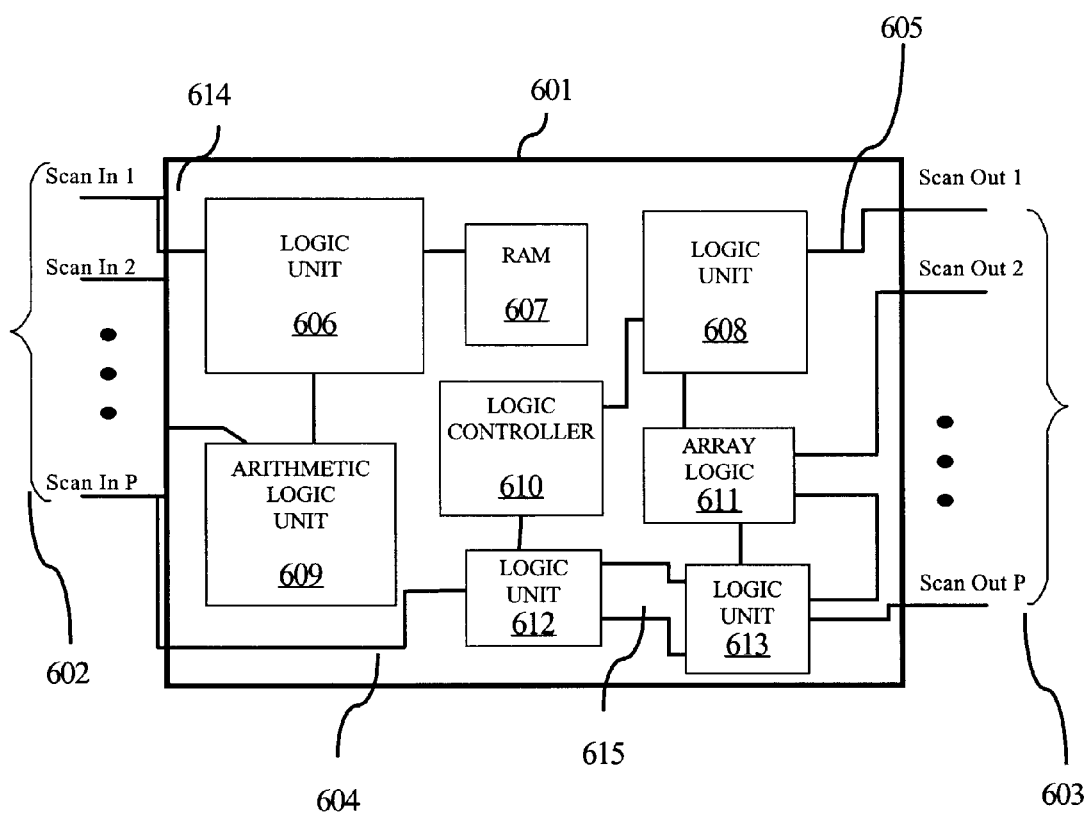
FIG. 6 illustrates a processor IC comprised of various logic units, an arithmetic logic unit, and random access memory (RAM) which may have scan chains optimized according to embodiments of the present invention.

FIG. 6 illustrates a processor IC 601 which may have scan chains optimized according to embodiments of the present invention. Processor IC 601 contains various logic units 606, 608, 609, 612, and 613. Processor IC 601 also contains RAM 607, array logic 611, and a logic controller 610. It should be noted that this processor IC is for illustration only is not meant to illustrates an exhaustive set of logic units or other circuits that may be present in a processor IC. Processor IC 601 also has scan input 602 and scan outputs 603. In this illustration, there are P scan inputs and corresponding P scan outputs for P scan chains. Exemplary scan connections 614 and 604 illustrate that the scan inputs feed into various scan chains internal to logic units (e.g., 606 and 612). Connection 605 illustrates a scan chain output coupled from logic unit 608 to a scan output 603. Connection 615 illustrates scan connections between logic unit 612 and 613. The scan chains internal to processor 601 may thread from scan inputs 602 through the various internal logic units and circuits and end in the scan outputs 603. Some of the scan chains are used for testing and some are used for both test and functional applications as explained earlier. Typically these scan chains are designed to give functional performance and to allow various tests needed for the processor IC. Optimization of the scan paths and balancing the number of scan circuit elements in each scan chain according to embodiments of the present invention improves the overall performance of the scan chains of the processor IC for both functional operation and test operation.

Figure 4:
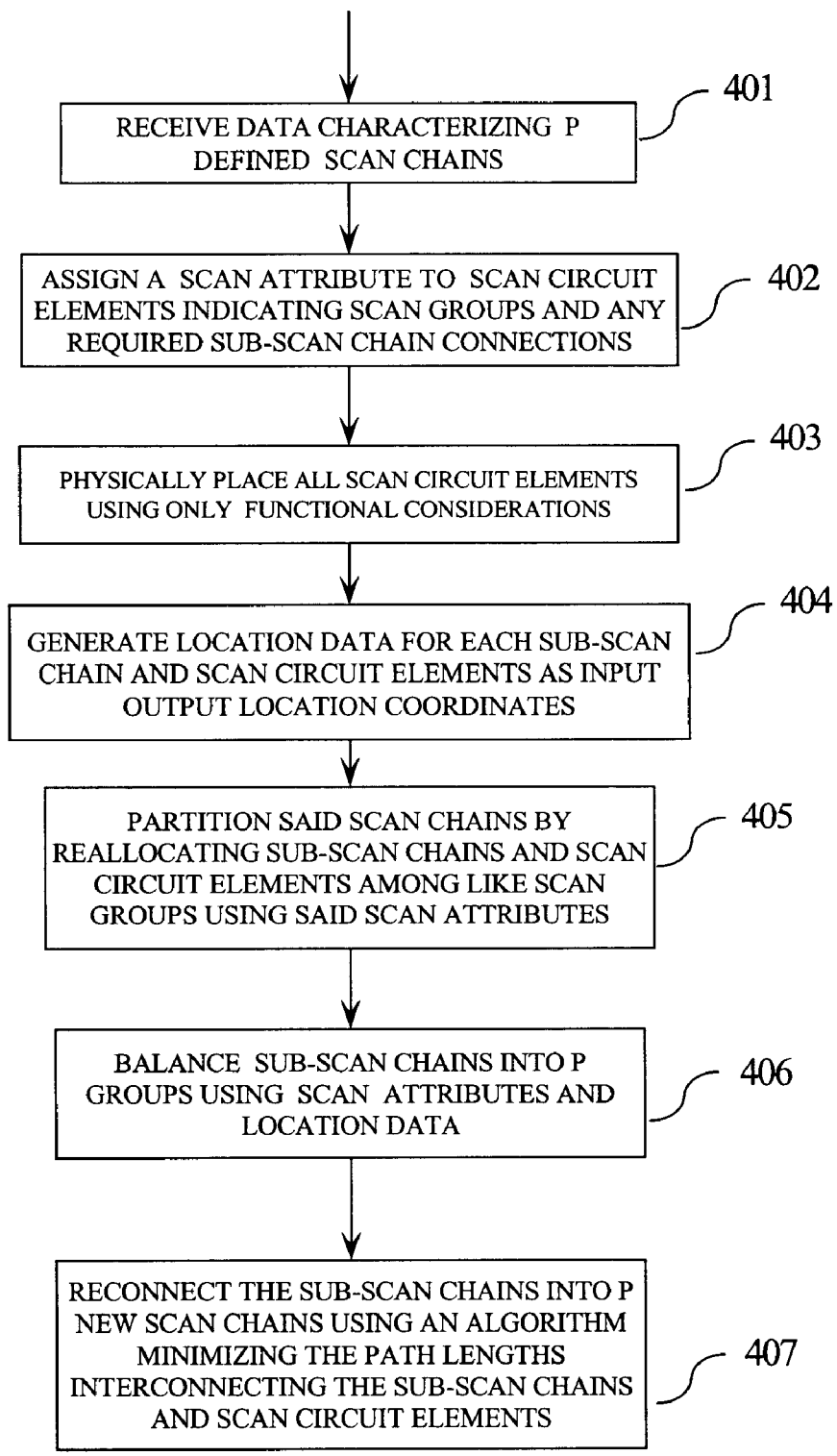
FIG. 4 illustrates method steps used in embodiments of the present invention.

FIG. 4 is a flow diagram of method steps in used in embodiments of the present invention. In step 401, data is received characterizing P scan chains using functional and test considerations. In step 402, scan attributes are assigned to scan circuit elements indicating scan groups and any required sub-scan connections. In step 403, the sub-scan chains and scan chain elements are physically placed using functional considerations in preference to test considerations. In step 404, the location data generated by physically placing the scan circuit elements are used to determine the location coordinates of all sub-scan inputs and outputs and scan circuit element inputs and outputs. In step 405, the scan chains are partitioned by reallocating sub-scan chains and scan circuit elements within like defined groups. Reallocating means reassigning scan circuit elements and sub-scan chains to be part of new scan chains which may differ from its pre-optimization scan chain. In step 406, the numbers of scan circuit elements are balanced between the P new scan chains. Balancing means to attempt to have similar numbers of scan circuit elements in each new scan chain. While some scan chains, because of restrictions in re-allocating scan circuit elements, may have a greater number of scan circuit elements, those scan chains that have less restrictions may have a better balance their number of scan chain elements. In step 407, the sub-scan chains are reconnected using an algorithm that minimizes path lengths interconnecting the sub-scan chains and scan circuit elements.

What is claimed is:

1. A method for optimizing P scan chains comprising scan circuit elements in an integrated circuit (IC), each of said P scan chains further comprising a scan input and a scan output, said method comprising the steps of:

assigning scan attributes to selected ones of said scan circuit elements;

partitioning said P scan chains into sub-scan chains, each of said sub-scan chains having a sub-scan input and a sub-scan output, using said scan attributes;

positioning said sub-scan chains within said IC, wherein positioning said sub-scan chains results in each sub-scan chain having location attributes, said location attributes defining a relative location of each sub-chain within said IC;

grouping said sub-scan chains into P new scan chains using said scan attributes and said location attributes; and reconnecting said sub-scan chains into said P new scan chains using an algorithm that minimizes the path length interconnecting said sub-scan chains in each of said P new scan chains.

2. The method of claim 1, wherein said scan attributes comprise a first scan attribute defining a first scan circuit element wired to a first scan latch in a scan chain, a second scan attribute defining a last scan circuit element wired to a last scan latch in a scan chain, a third scan attribute defining a retained input connection to a scan circuit element and a fourth scan attribute defining a retained output connection to a scan circuit element.

3. The method of claim 2, wherein a value of said second scan attribute further defines scan circuit elements associated with said second scan attribute as also being assigned to a same group of scan circuit elements.

4. The method of claim 2, wherein said first scan attribute further determines if an input connection of said first scan circuit element to a scan input is retained and said second scan attribute determines if an output connection of said last scan circuit to a scan output is retained.

5. The method of claim 2, wherein a scan circuit element may have more than one of said scan attributes.

6. The method of claim 1, wherein said sub-scan chains comprise one or more scan circuit elements.

7. The method of claim 1, wherein selected ones of said scan circuit elements have both a functional and a scan chain test operation and are positioned on said IC using only considerations associated with said functional operation.

8. The method of claim 1, wherein said location attributes define location coordinates within said IC for said sub-scan inputs and sub-scan outputs.

9. The method of claim 1, wherein said algorithm used to reconnect said sub-scan chains further balances the number of scan circuit elements within each of said P new scan chains.

10. A computer program product embodied in a machine readable medium, including programming for a processor system, comprising a program of instructions for optimizing P scan chains comprising scan circuit elements in an integrated circuit (IC), each of said P scan chains further comprising a scan input and a scan output, said program of instructions performing the program steps of:

assigning scan attributes to said scan circuit elements;

partitioning said P scan chains into sub-scan chains, each of said sub-scan chains having a sub-scan input and a sub-scan output, using said scan attributes;

positioning said sub-scan chains within said IC, wherein positioning said sub-scan chains results in each sub-scan chain having location attributes, said location attributes defining a relative location of each sub-chain within said IC;

grouping said sub-scan chains into P new scan chains using said scan attributes and said location attributes; and reconnecting said sub-scan chains into said P new scan chains using an algorithm that minimizes the path length interconnecting said sub-scan chains in each of said P new scan chains.

11. The computer program product of claim 10, wherein said scan attributes comprise a first scan attribute defining a first scan circuit element wired to a first scan latch in a scan chain, a second scan attribute defining a last scan circuit element wired to a last scan, latch in a scan chain, a third scan attribute defining a retained input connection to a scan circuit element and a fourth scan attribute defining a retained output connection to a scan circuit element.

12. The computer program product of claim 11, wherein a value of said second scan attribute further defines scan circuit elements associated with said second scan attribute as also being assigned to a same group of scan circuit elements.

13. The computer program product of claim 11, wherein a scan circuit element may have more than one of said scan attributes.

14. The computer program product of claim 11, wherein said first scan attribute further determines if an input connection of said first scan circuit element to a scan input is retained and said second scan attribute determines if an output connection of said last scan circuit to a scan output is retained.

15. The computer program product of claim 10, wherein said sub-scan chains comprise one or more scan circuit elements.

16. The computer program product of claim 10, wherein selected ones of said scan circuit elements have both a functional and a scan chain test operation and are positioned on said IC using only said functional consideration.

17. The computer program product of claim 10, wherein said location attributes define location coordinates within said IC for said sub-scan inputs and sub-scan outputs.

18. The computer program product of claim 10, wherein said algorithm used to reconnect said sub-scan chains further balances the number of scan circuit elements within each of said P new scan chains.

* * * * *